(12) United States Patent
Hasan et al.

(10) Patent No.: US 12,510,832 B2
(45) Date of Patent: Dec. 30, 2025

(54) FABRICATION PROCESS DEVIATION DETERMINATION METHOD, CALIBRATION METHOD, INSPECTION TOOL, FABRICATION SYSTEM AND A SAMPLE

(71) Applicant: ASML NETHERLANDS B.V., Veldhoven (NL)

(72) Inventors: Shakeeb Bin Hasan, Montreal (CA); Nitish Kumar, Eindhoven (NL)

(73) Assignee: ASML NETHERLANDS B.V., Veldhoven (NL)

(*) Notice: Subject to any disclaimer, the term of this patent is extended or adjusted under 35 U.S.C. 154(b) by 139 days.

(21) Appl. No.: 18/016,773

(22) PCT Filed: Jun. 29, 2021

(86) PCT No.: PCT/EP2021/067854
§ 371 (c)(1),
(2) Date: Jan. 18, 2023

(87) PCT Pub. No.: WO2022/028778
PCT Pub. Date: Feb. 10, 2022

(65) Prior Publication Data
US 2023/0280661 A1    Sep. 7, 2023

(30) Foreign Application Priority Data

Aug. 5, 2020 (EP) .................................... 20189673
Jun. 9, 2021 (EP) .................................... 21178570

(51) Int. Cl.
*G03F 7/00* (2006.01)
(52) U.S. Cl.
CPC ........ *G03F 7/7065* (2013.01); *G03F 7/70125* (2013.01)

(58) Field of Classification Search
CPC ............ G03F 7/70125; G03F 7/70608; G03F 7/70616; G03F 7/70625; G03F 7/70641;
(Continued)

(56) References Cited

U.S. PATENT DOCUMENTS 5,607,800 A    3/1997  Ziger
6,952,253 B2   10/2005 Lof et al.
(Continued)

FOREIGN PATENT DOCUMENTS

CN    107924118        4/2018
JP    2006518942 A  *  8/2006    ........... G03F 9/7088
TW    201919143        5/2019

OTHER PUBLICATIONS

International Search Report and Written Opinion issued in PCT Patent Application No. PCT/EP2021/067854, dated Sep. 27, 2021.
(Continued)

*Primary Examiner* — Peter B Kim
(74) *Attorney, Agent, or Firm* — Pillsbury Winthrop Shaw Pittman, LLP (57) ABSTRACT

A method for determining deviations in a fabrication process, the method including: providing a sample with a layer having a periodic structure fabricated using the fabrication process and intended to cause a corresponding part of the layer to be fully reflective for light having a wavelength in a wavelength range and having an angle of incidence in an angle range; illuminating the sample with light having a wavelength in the wavelength range and an angle of incidence in the angle range; detecting light reflected and/or scattered from the layer of the sample; and determining deviations in the fabrication process from the detected light.

20 Claims, 3 Drawing Sheets

(58) Field of Classification Search
CPC .............. G03F 7/7065; G03F 7/70683; G03F 7/70516; G03F 7/70591; G03F 7/706833; G03F 7/706851
See application file for complete search history.

(56) References Cited

U.S. PATENT DOCUMENTS

| | | |
|---|---|---|
| 2015/0233818 A1* | 8/2015 | Manassen .............. G01N 21/41 716/30 |
| 2016/0282282 A1 | 9/2016 | Quintanilha et al. |
| 2019/0148123 A1 | 5/2019 | Lee et al. |
| 2019/0246480 A1 | 8/2019 | Polyakov et al. |

OTHER PUBLICATIONS

Office Action issued in Taiwanese Patent Application No. 110126730, dated Aug. 22, 2022.
Search Report issued in European Patent Application No. 20189673, dated Feb. 3, 2021.
J.P. Moura et al., "Centimeter-scale suspended photonic crystal mirrors", Optics Express, vol. 26, No. 2, pp. 1895-1909 (2018).

* cited by examiner

FABRICATION PROCESS DEVIATION DETERMINATION METHOD, CALIBRATION METHOD, INSPECTION TOOL, FABRICATION SYSTEM AND A SAMPLE

CROSS-REFERENCE TO RELATED APPLICATIONS

This application is the U.S. national phase entry of PCT application no. PCT/EP2021/067854 which was filed on Jun. 29, 2021. which claims priority of European patent application no. 20189673.5 which was filed on Aug. 5, 2020 and of European patent application no. 21178570.4 which was filed on Jun. 9, 2021, which are incorporated herein in their entireties by reference.

FIELD

The present disclosure relates to a method for determining deviations in a fabrication process, a method for calibrating a fabrication process, an inspection tool, a fabrication system and a sample to be used in the aforementioned method and inspection tool.

BACKGROUND

A lithographic apparatus is a machine constructed to apply a desired pattern onto a substrate. A lithographic apparatus can be used, for example, in the manufacture of integrated circuits (ICs). A lithographic apparatus may, for example, project a pattern (also often referred to as "design layout" or "design") of a patterning device (e.g., a mask) onto a layer of radiation-sensitive material (resist) provided on a substrate (e.g., a wafer).

As semiconductor manufacturing processes continue to advance, the dimensions of circuit elements have continually been reduced while the amount of functional elements, such as transistors, per device has been steadily increasing over decades, following a trend commonly referred to as 'Moore's law'. To keep up with Moore's law the semiconductor industry is chasing technologies that enable to create increasingly smaller features. To project a pattern on a substrate a lithographic apparatus may use electromagnetic radiation. The wavelength of this radiation determines the minimum size of features which are patterned on the substrate. Typical wavelengths currently in use are 365 nm (i-line), 248 nm, 193 nm and 13.5 nm. A lithographic apparatus, which uses extreme ultraviolet (EUV) radiation, having a wavelength within a range of 4 nm to 20 nm, for example 6.7 nm or 13.5 nm, may be used to form smaller features on a substrate than a lithographic apparatus which uses, for example, radiation with a wavelength of 193 nm.

In manufacturing processes of integrated circuits (ICs), unfinished or finished circuit components are inspected to ensure that they are manufactured according to design and are free of defects. Inspection systems utilizing optical (e.g. scatterometric) microscopes or charged particle (e.g. electron) beam microscopes, such as a scanning electron microscope (SEM) can be employed.

A drawback of a SEM is that the measurement is limited due to noise, speed and/or charging of the sample. A drawback of optical scatterometric techniques is that the signal-to-noise ratio is often relatively low due to signal contributions from other parts of the sample compared to the signal contribution of the part of interest.

SUMMARY

Considering the above, it is an object of the invention to provide an inspection tool and corresponding method allowing an improved determination of fabrication process deviations.

According to an embodiment of the invention, there is provided a method for determining deviations in a fabrication process, comprising the following steps:
a. providing a sample with a layer having a periodic structure fabricated using the fabrication process and intended to cause a corresponding part of the layer to be fully reflective for light having a wavelength in a wavelength range and having an angle of incidence in an angle range;
b. illuminating the sample with light having a wavelength in the wavelength range and an angle of incidence in the angle range;
c. detecting light reflected and/or scattered from the layer of the sample; and
d. determining deviations in the fabrication process from the detected light.

According to another embodiment of the invention, there is provided a method for calibrating a fabrication process, comprising the following steps:
a. carrying out a method according to the invention to determine deviations in a fabrication process; and
b. generating a correction signal for adjusting a fabrication process parameter based on the determined deviations in the fabrication process.

According to a further embodiment of the invention, there is provided an inspection tool comprising:
a sample holder for holding a sample;
an illumination system for illuminating a sample in the sample holder;
a detection system for detecting light reflected or scattered from a sample in the sample holder; and
a processing unit configured to determine deviations in a fabrication process used to fabricate a sample with a layer having a periodic structure intended to cause a corresponding part of the layer to be fully reflective for light having a wavelength in a wavelength range and having an angle of incidence in an angle range from an output of the detection system,
wherein the illumination system is configured to emit light having a wavelength in the wavelength range and having an angle of incidence in the angle range.

According to yet another embodiment of the invention, there is provided a fabrication system comprising a lithographic apparatus for carrying out at least a part of a fabrication process, and an inspection tool according to the invention.

According to another embodiment of the invention, there is provided a sample with a layer having a periodic structure intended to cause a corresponding part of the layer to be fully reflective for light having a wavelength in a wavelength range and having an angle of incidence in an angle range, wherein the sample is suitable to be used in a method according to the invention or an inspection tool according to the invention.

According to a further embodiment of the invention, there is provided a method for determining deviations in a fabrication process, comprising the following steps:
a. providing a sample with a layer having a periodic structure fabricated using the fabrication process and intended to cause a corresponding part of the layer to be fully reflective for light having a wavelength in a wavelength range and having an angle of incidence in an angle range;

b. illuminating the sample with light having a wavelength in the wavelength range and an angle of incidence in the angle range;

c. detecting light transmitted through the sample; and d. determining deviations in the fabrication process from the detected light.

According to yet another embodiment of the invention, there is provided a method for calibrating a fabrication process, comprising the following steps:

a. providing a sample with a layer having a periodic structure fabricated using the fabrication process and intended to cause a corresponding part of the layer to be fully reflective for light having a wavelength in a wavelength range and having an angle of incidence in an angle range;

b. illuminating the sample with light having a wavelength in the wavelength range and an angle of incidence in the angle range;

c. detecting light transmitted through the sample;

d. determining deviations in the fabrication process from the detected light; and e. generating a correction signal for adjusting a fabrication process parameter based on the determined deviations in the fabrication process.

According to another embodiment of the invention, there is provided an inspection tool comprising:

a sample holder for holding a sample;

an illumination system for illuminating a sample in the sample holder;

a detection system for detecting light transmitted through a sample in the sample holder; and a processing unit configured to determine deviations in a fabrication process used to fabricate a sample with a layer having a periodic structure intended to cause a corresponding part of the layer to be fully reflective for light having a wavelength in a wavelength range and having an angle of incidence in an angle range from an output of the detection system, wherein the illumination system is configured to emit light having a wavelength in the wavelength range and having an angle of incidence in the angle range.

According to a further embodiment of the invention, there is provided a fabrication system comprising a lithographic apparatus for carrying out at least a part of a fabrication process, and an inspection tool comprising:

a sample holder for holding a sample;

an illumination system for illuminating a sample in the sample holder;

a detection system for detecting light transmitted through a sample in the sample holder; and a processing unit configured to determine deviations in a fabrication process used to fabricate a sample with a layer having a periodic structure intended to cause a corresponding part of the layer to be fully reflective for light having a wavelength in a wavelength range and having an angle of incidence in an angle range from an output of the detection system, wherein the illumination system is configured to emit light having a wavelength in the wavelength range and having an angle of incidence in the angle range.

BRIEF DESCRIPTION OF THE DRAWINGS

Embodiments of the present disclosure will now be described, by way of example only, with reference to the accompanying schematic drawings, in which.

DETAILED DESCRIPTION

Reference will now be made in detail to exemplary embodiments, examples of which are illustrated in the accompanying drawings. The following description refers to the accompanying drawings in which the same numbers in different drawings represent the same or similar elements unless otherwise represented, and only the differences with respect to the individual embodiments are described. The implementations set forth in the following description of exemplary embodiments do not represent all implementations. Instead, they are merely examples of apparatuses and methods consistent with aspects related to the disclosed embodiments as recited in the appended claims.

Relative dimensions of components in drawings may be exaggerated for clarity. As used herein, unless specifically stated otherwise, the term "or" encompasses all possible combinations, except where infeasible. For example, if it is stated that a component may include A or B, then, unless specifically stated otherwise or infeasible, the component may include A, or B, or A and B. As a second example, if it is stated that a component may include A, B, or C, then, unless specifically stated otherwise or infeasible, the component may include A, or B, or C, or A and B, or A and C, or B and C, or A and B and C.

In the present document, the terms "radiation" and "beam" are used to encompass all types of electromagnetic radiation, including ultraviolet radiation (e.g. with a wavelength of 365, 248, 193, 157 or 126 nm) and EUV (extreme ultra-violet radiation, e.g. having a wavelength in the range of about 5-100 nm).

The term "reticle", "mask" or "patterning device" as employed in this text may be broadly interpreted as referring to a generic patterning device that can be used to endow an incoming radiation beam with a patterned cross-section, corresponding to a pattern that is to be created in a target portion of the substrate. The term "light valve" can also be used in this context. Besides the classic mask (transmissive or reflective, binary, phase-shifting, hybrid, etc.), examples of other such patterning devices include a programmable mirror array and a programmable LCD array.

Figure 1:
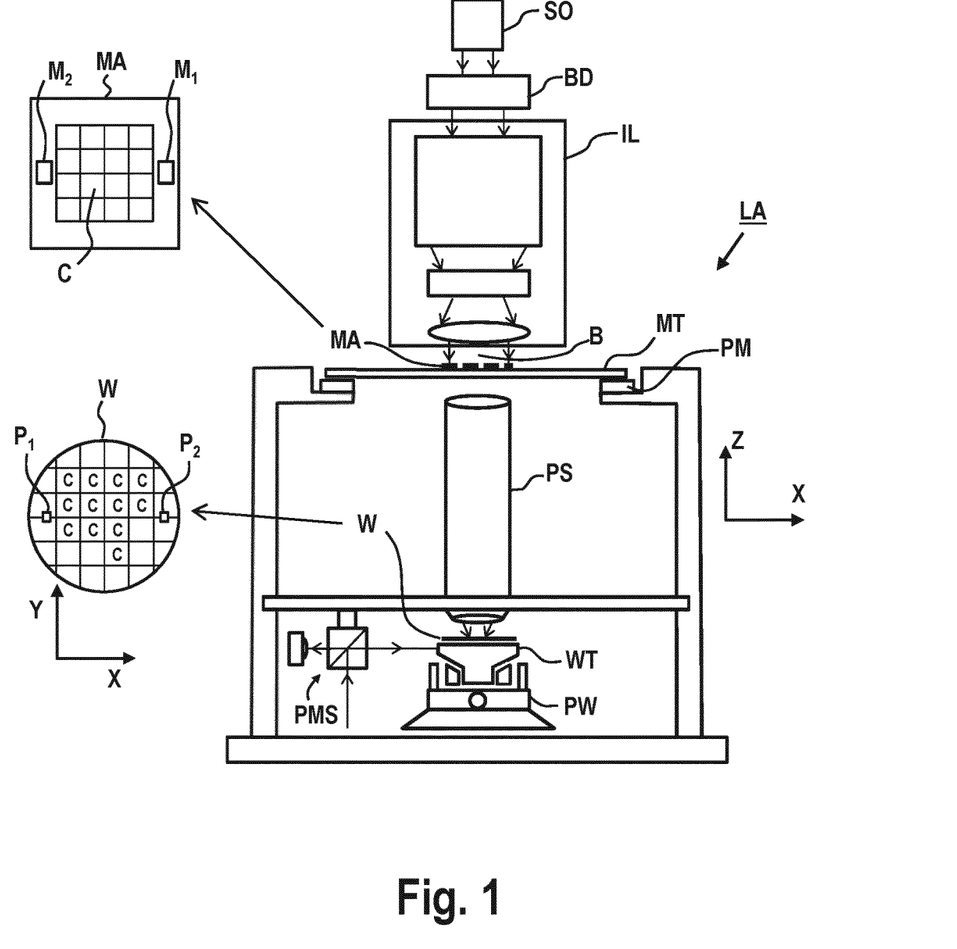
FIG. 1 depicts a schematic overview of a lithographic apparatus according to an embodiment of the invention.

FIG. 1 schematically depicts a lithographic apparatus LA. The lithographic apparatus LA includes an illumination system (also referred to as illuminator) IL configured to condition a radiation beam B (e.g., UV radiation, DUV radiation or EUV radiation), a mask support (e.g., a mask table) MT constructed to support a patterning device (e.g., a mask) MA and connected to a first positioner PM configured to accurately position the patterning device MA in accordance with certain parameters, a substrate support (e.g., a wafer table) WT constructed to hold a substrate (e.g., a resist coated wafer) W and connected to a second positioner PW configured to accurately position the substrate support in accordance with certain parameters, and a projection system (e.g., a refractive projection lens system) PS configured to project a pattern imparted to the radiation beam B by patterning device MA onto a target portion C (e.g., comprising one or more dies) of the substrate W.

In operation, the illumination system IL receives a radiation beam from a radiation source SO, e.g. via a beam delivery system BD. The illumination system IL may include various types of optical components, such as refractive, reflective, magnetic, electromagnetic, electrostatic, and/or other types of optical components, or any combination thereof, for directing, shaping, and/or controlling radiation. The illuminator IL may be used to condition the radiation beam B to have a desired spatial and angular intensity distribution in its cross section at a plane of the patterning device MA.

The term "projection system" PS used herein should be broadly interpreted as encompassing various types of projection system, including refractive, reflective, catadioptric, anamorphic, magnetic, electromagnetic and/or electrostatic optical systems, or any combination thereof, as appropriate for the exposure radiation being used, and/or for other factors such as the use of an immersion liquid or the use of a vacuum. Any use of the term "projection lens" herein may be considered as synonymous with the more general term "projection system" PS.

The lithographic apparatus LA may be of a type wherein at least a portion of the substrate may be covered by a liquid having a relatively high refractive index, e.g., water, so as to fill a space between the projection system PS and the substrate W—which is also referred to as immersion lithography. More information on immersion techniques is given in U.S. Pat. No. 6,952,253, which is incorporated herein by reference.

The lithographic apparatus LA may also be of a type having two or more substrate supports WT (also named "dual stage"). In such "multiple stage" machine, the substrate supports WT may be used in parallel, and/or steps in preparation of a subsequent exposure of the substrate W may be carried out on the substrate W located on one of the substrate support WT while another substrate W on the other substrate support WT is being used for exposing a pattern on the other substrate W.

In addition to the substrate support WT, the lithographic apparatus LA may comprise a measurement stage. The measurement stage is arranged to hold a sensor and/or a cleaning device. The sensor may be arranged to measure a property of the projection system PS or a property of the radiation beam B. The measurement stage may hold multiple sensors. The cleaning device may be arranged to clean part of the lithographic apparatus, for example a part of the projection system PS or a part of a system that provides the immersion liquid. The measurement stage may move beneath the projection system PS when the substrate support WT is away from the projection system PS.

In operation, the radiation beam B is incident on the patterning device, e.g. mask, MA which is held on the mask support MT, and is patterned by the pattern (design layout) present on patterning device MA. Having traversed the patterning device MA, the radiation beam B passes through the projection system PS, which focuses the beam onto a target portion C of the substrate W. With the aid of the second positioner PW and a position measurement system IF, the substrate support WT can be moved accurately, e.g., so as to position different target portions C in the path of the radiation beam B at a focused and aligned position. Similarly, the first positioner PM and possibly another position sensor (which is not explicitly depicted in FIG. 1) may be used to accurately position the patterning device MA with respect to the path of the radiation beam B. Patterning device MA and substrate W may be aligned using mask alignment marks M1, M2 and substrate alignment marks P1, P2. Although the substrate alignment marks P1, P2 as illustrated occupy dedicated target portions, they may be located in spaces between target portions. Substrate alignment marks P1, P2 are known as scribe-lane alignment marks when these are located between the target portions C.

To clarify the invention, a Cartesian coordinate system is used. The Cartesian coordinate system has three axes, i.e., an x-axis, a y-axis and a z-axis. Each of the three axis is orthogonal to the other two axes. A rotation around the x-axis is referred to as an Rx-rotation. A rotation around the y-axis is referred to as an Ry-rotation. A rotation around about the z-axis is referred to as an Rz-rotation. The x-axis and the y-axis define a horizontal plane, whereas the z-axis is in a vertical direction. The Cartesian coordinate system is not limiting the invention and is used for clarification only. Instead, another coordinate system, such as a cylindrical coordinate system, may be used to clarify the invention. The orientation of the Cartesian coordinate system may be different, for example, such that the z-axis has a component along the horizontal plane.

Figure 2:
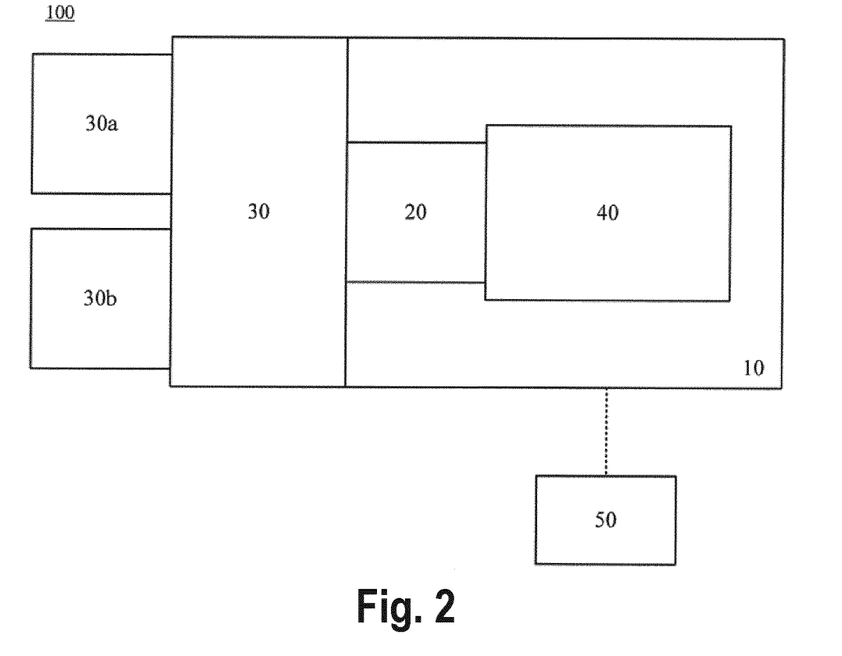
FIG. 2 depicts a schematic diagram illustrating an exemplary inspection system, consistent with embodiments of the present disclosure.

Reference is now made to FIG. 2, which illustrates an exemplary inspection (EBI) system 100 consistent with embodiments of the present disclosure. As shown in FIG. 2, inspection system 100 includes a main chamber 10, a load-lock chamber 20, an inspection tool 40, and an equipment front end module (EFEM) 30. Inspection tool 40 is located within main chamber 10.

EFEM 30 includes a first loading port 30a and a second loading port 30b. EFEM 30 may include additional loading port(s). First loading port 30a and second loading port 30b receive wafer front opening unified pods (FOUPs) that contain wafers (e.g., semiconductor wafers or wafers made of other material(s)) or samples to be inspected (wafers and samples are collectively referred to as "wafers" hereafter). One or more robot arms (not shown) in EFEM 30 transport the wafers to load-lock chamber 20.

Load-lock chamber 20 may be connected to a load/lock vacuum pump system (not shown), which removes gas molecules in load-lock chamber 20 to reach a first pressure below atmospheric pressure. After reaching the first pressure, one or more robot arms (not shown) transport the wafer from load-lock chamber 20 to main chamber 10. Main chamber 10 may be connected to a main chamber vacuum pump system (not shown), which removes gas molecules in main chamber 10 to reach a second pressure below the first pressure. After reaching the second pressure, the wafer is subject to inspection by inspection tool 40.

Controller 50 may be electronically connected to inspection tool 40 and may be electronically connected to other components as well. Controller 50 may be a computer configured to execute various controls of inspection system 100. Controller 50 may also include processing circuitry configured to execute various signal and image processing functions. While controller 50 is shown in FIG. 2 as being outside of the structure that includes main chamber 10, load-lock chamber 20, and EFEM 30, it is appreciated that controller 50 can be part of the structure.

While the present disclosure provides examples of main chamber 10 housing an inspection tool 40, it should be noted that aspects of the disclosure in their broadest sense, are not limited to a chamber housing an inspection tool. Rather, it is appreciated that the foregoing principles may be applied to other chambers as well.

Figure 3:
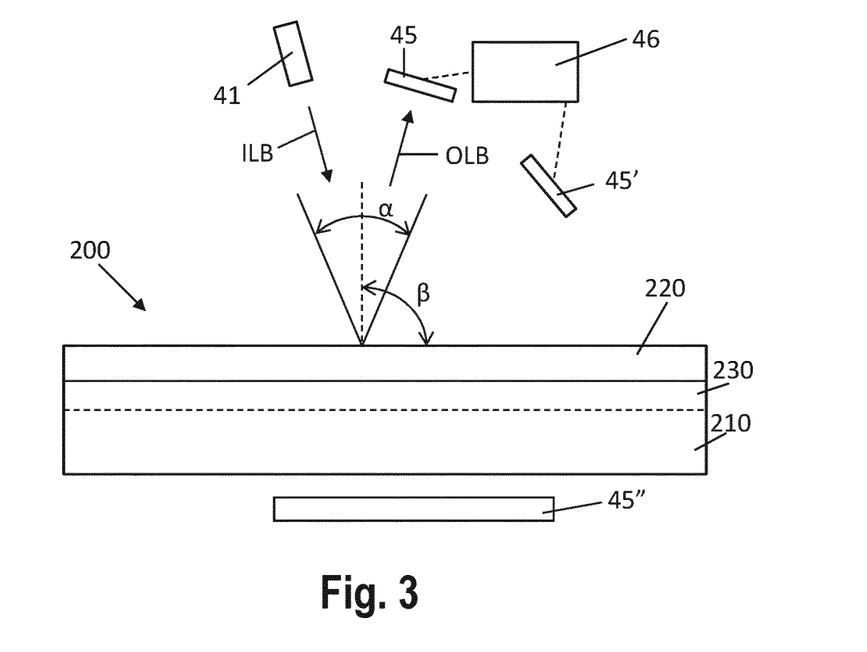
FIG. 3 schematically depicts a cross-section of an exemplary sample to be inspected using the inspection system of FIGS. 2.

Reference is now made to FIG. 3, which illustrates a cross-section of an exemplary sample 200 to be inspected by inspection system 100. The sample 200 includes a substrate 210 with a top layer 220. The top layer 220 has been provided with a periodic structure fabricated using a fabrication process at least partially carried out by the lithographic apparatus of FIG. 1. The periodic structure is intended to cause a corresponding part of the layer 220 to be fully reflective for light having a wavelength in a wavelength range and having an angle of incidence in an angle range.

Figure 4:
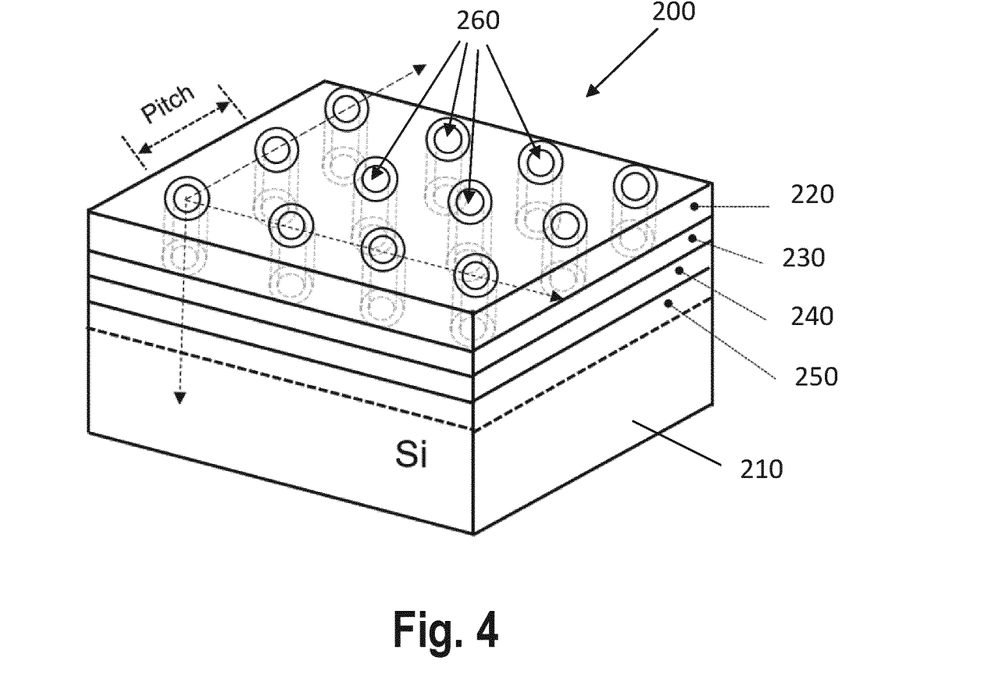
FIG. 4 schematically depicts an example of a 2D periodic structure that can be used with the sample of FIG. 3.

FIG. 4 depicts a perspective view of a portion of a sample 200 including a two-dimensional periodic dielectric structure as an exemplary periodic structure. However, it is envisaged that the periodic structure can also be one-dimensional meaning such that seen in plan view, i.e. top view, the periodic structure consists of alternating lines of material having a different dielectric constant to form a band gap in a single direction. The periodic structure may alternatively be referred to as photonic crystal. A Bragg grating is an example of a one-dimensional periodic structure. For a two-dimensional periodic structure, there exist two orthogonal directions in which material of one dielectric constant is alternated with material of another different dielectric constant to form a band gap in two directions, seen in plan view, i.e. top view. An example of a two-dimensional periodic structure is an array of holes formed in the substrate.

FIG. 4 depicts such an example. Shown are a silicon substrate 210, but this could be any suitable substrate material. The substrate includes a top layer 220 and adjacent layers 230, 240 and 250. The top layer 220 is provided with an array of holes 260 at a predetermined pitch to form a two-dimensional periodic structure.

The angle range may be defined as a cone with cone angle α centered around a mean angle β. In an extreme case, the mean angle β is 90 degrees relative to a top surface of the layer 220 and the cone angle α is 180 degrees meaning that the corresponding part of the layer with the periodic structure is intended to be fully reflective for all angles of incidence. However, cone angles α of less than 180 degrees and mean angles β other than 90 degrees are also envisaged.

It is explicitly noted here that the periodic structure of the layer 220 extends in a direction parallel to the layer itself and that the cone extends substantially perpendicular to the layer 220. Although reference is made to photonic crystals, the invention does not make use of the optical band gap associated with photonic crystals, which photonic crystals exhibit periodicity in the direction of incidence of illuminating light. In fact, when periodic structures that exhibit band gap in lower dimensions (1D or 2D) are realized in 3D, the optical band gap may be lost. However, the invention makes use of the property that the periodic structure retains its ability to act as a perfectly reflecting mirror. The periodic structure may therefore alternatively be referred to as being intended to act as an omni-directional mirror, i.e. making use of the omni-directional reflectance effect.

In contrast, e.g. US2019/0148123A1 discloses the use of photonic crystals and employs the use of the optical band gap by illuminating the periodic structure in plane of the periodic structure instead of substantially perpendicular to the periodic structure as in this invention. Hence, the layer 220 has a length, a width and a thickness, with the thickness being smaller than the width, and the width being equal to or smaller than the length, and a top surface and bottom surface extending in length and width direction and side surfaces extending in thickness direction. In US2019/0148123A1, the side surfaces of the layer are illuminated while in the invention the top or bottom surface is illuminated.

The intended full reflectivity of the corresponding part of the layer 220 can be used to determine deviations in the fabrication process of the sample, in particular the fabrication process of the layer with the periodic structure. When light having a wavelength in the wavelength range is directed towards the layer 220 at an angle of incidence in the angle range by an illumination system 41 as indicated by arrow ILB, full reflectivity of the layer will cause all the light to be reflected as indicated by arrow OLB, so that when this light is captured by a detector 45 of a detection system, the intensity of the light captured by the detector 45 should be equal to the intensity of the light transmitted by the illumination system 41.

However, when the fabrication process introduces errors in the periodic structure, such as a different in plane dimension, a different pitch, a different position, a different thickness of the periodic structure or random particles captured in the layer 220, this will cause the periodic structure to lose its full reflectivity capability resulting in some of the light transmitted towards the layer 220 being absorbed or scattered in other directions so that the intensity of the light changes or other parts of the detection system receive light as well. Other changes in the reflected light may include a change in phase or polarization. These deviations from the expected ideal situation in the detected light can then be used by a processing unit 46 to determine the deviations in the fabrication process.

This is in contrast to for instance U.S. Pat. No. 5,607,800A1 in which a reflectance spectrum is obtained as some kind of fingerprint of a particular pattern and deviations can be determined by looking at deviations from the ideal fingerprint. Hence, it is not important what the reflectivity is, i.e. omni-directional mirror features are not employed and it is not intended to obtain full reflectivity. Instead, the reflectivity pattern as function of wavelength is relevant.

Although FIG. 3 only depicts the measurement of a single light beam ILB and the detection of light reflected from the layer of the sample, it is envisaged that a plurality of measurements is needed in which at least one of the following is varied:
  a wavelength of the light emitted towards the sample;
  an angle of incidence of the light emitted towards the sample; and
  an intensity of the light emitted towards the sample.

Although FIG. 3 only depicts the detection of light reflected from the layer of the sample, the detection system 45 may alternatively or additionally include detectors e.g. measuring light scattered from the layer of the sample. As an example, a detector 45' is shown in dashed lines, which detector 45' may be used along with detector 45 or may be used instead of detector 45.

The detection system 45 may include pixelated detectors which may have the advantage that both light that is reflected from the layer as well as light scattered from the layer can be detected simultaneously.

Additionally or alternatively, the detection system may include a detector 45" below the sample to detect light transmitted through the sample 200.

Although the sample 200 includes a top layer 220 with a periodic structure as mentioned above, it is alternatively or additionally possible that the sample includes a top layer 220 and a layer 230 below the top layer 220, wherein the periodic structure as mentioned above is formed in the layer 230. Using a periodic structure in the layer 230 below the top layer 220 may be useful to determine displacements between the two layers as well, i.e. the overlay, when the layer 220 has some structure to act as a reference. When only the layer 230 is provided with the periodic structure, the thickness of the layer 230 may be determinable when the layer 220 is a plain film. Further, when both the layers 220 and 230 have a periodic structure, the relative displacement, i.e. the overlay, may be determined if the layer thickness of layer 220 is sufficiently small.

Once the deviations in the fabrication process have been determined, the processing unit 46 or any other control unit, may generate a correction signal for adjusting a fabrication process parameter based on the determined deviations in the fabrication process. The aim of the corrections signal is then to change the fabrication process in order to reduce the deviations. Hence, this can be an iterative process to minimize the deviations in the fabrication process and thus to improve accuracy and/or yield of the fabrication process.

In an embodiment, generating a correction signal includes generating a correction signal for adjusting a parameter of an apparatus used during the fabrication process. In case of the lithographic apparatus of FIG. 1, the parameter of the apparatus may be a parameter of the illumination system or the projection system of the lithographic apparatus.

In an embodiment, generating a correction signal includes generating a correction signal for adjusting a design parameter used as input to the fabrication process. In case of the lithographic apparatus of FIG. 1, the design parameter may be a relationship between a pattern imparted to the radiation by the patterning device and a corresponding intended structure on the substrate.

The lithographic apparatus of FIG. 1 may be combined with the inspection system of FIG. 2 to form a fabrication system, for instance by integrating the inspection system, or at least the inspection tool, with the lithographic apparatus.

Although specific reference may be made in this text to the use of a lithographic apparatus in the manufacture of ICs, it should be understood that the lithographic apparatus described herein may have other applications. Possible other applications include the manufacture of integrated optical systems, guidance and detection patterns for magnetic domain memories, flat-panel displays, liquid-crystal displays (LCDs), thin-film magnetic heads, etc.

Although specific reference may be made in this text to embodiments of the invention in the context of a lithographic apparatus, embodiments of the invention may be used in other apparatus. Embodiments of the invention may form part of a mask inspection apparatus, a metrology apparatus, or any apparatus that measures or processes an object such as a wafer (or other substrate) or mask (or other patterning device). These apparatus may be generally referred to as lithographic tools. Such a lithographic tool may use vacuum conditions or ambient (non-vacuum) conditions.

Although specific reference may have been made above to the use of embodiments of the invention in the context of optical lithography, it will be appreciated that the invention, where the context allows, is not limited to optical lithography and may be used in other applications, for example imprint lithography.

Where the context allows, embodiments of the invention may be implemented in hardware, firmware, software, or any combination thereof. Embodiments of the invention may also be implemented as instructions stored on a machine-readable medium, which may be read and executed by one or more processors. A machine-readable medium may include any mechanism for storing or transmitting information in a form readable by a machine (e.g., a computing device). For example, a machine-readable medium may include read only memory (ROM); random access memory (RAM); magnetic storage media; optical storage media; flash memory devices; electrical, optical, acoustical or other forms of propagated signals (e.g. carrier waves, infrared signals, digital signals, etc.), and others. Further, firmware, software, routines, instructions may be described herein as performing certain actions. However, it should be appreciated that such descriptions are merely for convenience and that such actions in fact result from computing devices, processors, controllers, or other devices executing the firmware, software, routines, instructions, etc. and in doing that may cause actuators or other devices to interact with the physical world.

The embodiments may further be described using the following clauses:

1. A method for determining deviations in a fabrication process, comprising the following steps:
   a. providing a sample with a layer having a periodic structure fabricated using the fabrication process and intended to cause a corresponding part of the layer to be fully reflective for light having a wavelength in a wavelength range and having an angle of incidence in an angle range;
   b. illuminating the sample with light having a wavelength in the wavelength range and an angle of incidence in the angle range;
   c. detecting light reflected and/or scattered from the layer of the sample; and
   d. determining deviations in the fabrication process from the detected light.
2. A method according to clause 1, wherein the layer having the periodic structure is intended to cause the corresponding part of the layer to be fully reflective for light having a wavelength in a wavelength range and all angles of incidence.
3. A method according to clause 1 or 2, wherein the periodic structure is a periodic dielectric structure.
4. A method according to any of clauses 1 to 3, wherein the periodic structure is a one-dimensional periodic structure.
5. A method according to any of clauses 1 to 3, wherein the periodic structure is a two-dimensional periodic structure.
6. A method according to any of clauses 1 to 5, wherein the sample includes a top layer having a periodic structure intended to cause a corresponding part of the layer to be fully reflective for light having a wavelength in a wavelength range and having an angle of incidence in an angle range.
7. A method according to any of clauses 1 to 6, wherein the sample includes a top layer and a layer below the top layer, and wherein the layer below the top layer has a periodic structure intended to cause a corresponding part of the layer to be fully reflective for light in a wavelength range and having an angle of incidence in an angle range.
8. A method according to any of clauses 1 to 7, wherein detecting light reflected and/or scattered of the layer of the sample includes measuring at least one of the following parameters:
   wavelength;
   amplitude;
   phase; and
   polarization.

9. A method according to any of the clauses 1 to 8, wherein the deviations in the fabrication process determinable from the detected light includes one or more of the following parameters:
   critical dimension;
   pitch;
   placement;
   thickness;
   displacement between two layers;
   random particles.
10. A method according to any of clauses 1 to 9, further comprising the step of detecting light transmitted through the sample, wherein the step of determining deviations in the fabrication process is also based on the detected light transmitted through the sample.
11. A method according to any of clauses 1 to 10, wherein the periodic structure forms an omni-directional mirror.
12. A method according to any of clauses 1 to 11, wherein the angle range is defined by a cone that is substantially perpendicular to the layer having the periodic structure.
13. A method for calibrating a fabrication process, comprising the following steps:
   a. carrying out a method according to any of the clauses 1 to 12 to determine deviations in the fabrication process; and
   b. generating a correction signal for adjusting a fabrication process parameter based on the determined deviations in the fabrication process.
14. A method according to clause 13, wherein generating a correction signal includes generating a correction signal for adjusting a parameter of an apparatus used during the fabrication process.
15. A method according to clause 13, wherein generating a correction signal includes generating a correction signal for adjusting a design parameter used as input to the fabrication process.
16. A method according to any of the clauses 1 to 15, wherein a lithographic apparatus is used for the fabrication process.
17. A method according to clause 16, wherein the lithographic apparatus comprises an illumination system configured to condition a radiation beam, a support constructed to support a patterning device, the patterning device being capable of imparting the radiation with a pattern in its cross-section to form a patterned radiation beam, a substrate table constructed to hold a substrate, and a projection system configured to project the patterned radiation beam onto a target portion of the substrate.
18. A method according to clause 14 and 17, wherein the parameter of the apparatus is a parameter of the illumination system or the projection system of the lithographic apparatus.
19. A method according to clause 15 and 17, wherein the design parameter is a relationship between a pattern imparted to the radiation by the patterning device and a corresponding intended structure on the substrate.
20. An inspection tool comprising:
   a sample holder for holding a sample;
   an illumination system for illuminating a sample in the sample holder;
   a detection system for detecting light reflected or scattered from a sample in the sample holder; and
   a processing unit configured to determine deviations in a fabrication process used to fabricate a sample with a layer having a periodic structure intended to cause a corresponding part of the layer to be fully reflective for light having a wavelength in a wavelength range and having an angle of incidence in an angle range from an output of the detection system,
   wherein the illumination system is configured to emit light having a wavelength in the wavelength range and having an angle of incidence in the angle range.
21. An inspection tool according to clause 20, wherein the processing unit includes a non-transitory computer readable medium including a relationship between one or more of a detected wavelength, amplitude, phase and polarization and one or more of the following parameters:
   critical dimension;
   pitch;
   placement;
   thickness;
   displacement between two layers; and
   random particles.
22. An inspection tool according to clause 20 or 21, wherein the detection system is further configured for detecting light transmitted through the sample.
23. An inspection tool according to any of clauses 20 to 22, wherein the processing unit is configured to generate a correction signal for adjusting a fabrication process parameter based on the determined deviations in the fabrication process.
24. An inspection tool according to clause 23, wherein the correction signal includes a correction signal for adjusting a parameter of an apparatus used during the fabrication process.
25. An inspection tool according to clause 23, wherein the correction signal includes a correction signal for adjusting a design parameter used as input to the fabrication process.
26. An inspection tool according to any of clauses 20-25, wherein the angle range is defined by a cone that is substantially perpendicular to the layer having the periodic structure.
27. A fabrication system comprising a lithographic apparatus for carrying out at least a part of a fabrication process, and an inspection tool according to any of clauses 20 to 26.
28. A fabrication system according to clause 27, wherein the lithographic apparatus comprises an illumination system configured to condition a radiation beam, a support constructed to support a patterning device, the patterning device being capable of imparting the radiation with a pattern in its cross-section to form a patterned radiation beam, a substrate table constructed to hold a substrate, and a projection system configured to project the patterned radiation beam onto a target portion of the substrate.
29. A fabrication system according to clause 28, wherein the inspection tool is an inspection tool according to clause 24, and wherein the parameter of the apparatus to be adjusted by the correction signal is a parameter of the illumination system or the projection system of the lithographic apparatus.
30. A fabrication system according to clause 28, wherein the inspection tool is an inspection tool according to clause 25, and wherein the design parameter to be adjusted by the correction signal is a relationship between a pattern imparted to the radiation by the patterning device and a corresponding intended structure on the substrate.

31. A fabrication system according to any of clauses 27 to 30, wherein the inspection tool is integrated in the lithographic apparatus.
32. A sample with a layer having a periodic structure intended to cause a corresponding part of the layer to be fully reflective for light having a wavelength in a wavelength range and having an angle of incidence in an angle range, wherein the sample is suitable to be used in a method according to any of clauses 1 to 19 or an inspection tool according to any of clauses 20 to 26.
33. A sample according to clause 32, wherein the layer having the periodic structure is intended to cause the corresponding part of the layer to be fully reflective for light having a wavelength in a wavelength range and all angles of incidence.
34. A sample according to clause 32 or 33, wherein the periodic structure is a periodic dielectric structure.
35. A sample according to any of clauses 32 to 34, wherein the periodic structure is a one-dimensional structure.
36. A sample according to any of clauses 32 to 34, wherein the periodic structure is a two-dimensional structure.
37. A sample according to any of clauses 32 to 36, wherein the sample includes a top layer having a periodic structure intended to cause a corresponding part of the layer to be fully reflective for light having a wavelength in a wavelength range and having an angle of incidence in an angle range.
38. A sample according to any of clauses 32 to 37, wherein the sample includes a top layer and a layer below the top layer, and wherein the layer below the top layer has a periodic structure intended to cause a corresponding part of the layer to be fully reflective for light in a wavelength range and having an angle of incidence in an angle range.
39. A sample according to any of clauses 32 to 38, wherein the periodic structure forms an omni-directional mirror.
40. A sample according to any of clauses 32-39, wherein the angle range is defined by a cone that is substantially perpendicular to the layer having the periodic structure.
41. A method for determining deviations in a fabrication process, comprising the following steps:
   a. providing a sample with a layer having a periodic structure fabricated using the fabrication process and intended to cause a corresponding part of the layer to be fully reflective for light having a wavelength in a wavelength range and having an angle of incidence in an angle range;
   b. illuminating the sample with light having a wavelength in the wavelength range and an angle of incidence in the angle range;
   c. detecting light transmitted through the sample; and
   d. determining deviations in the fabrication process from the detected light.
42. A method according to clause 41, wherein the periodic structure forms an omni-directional mirror.
43. A method according to clause 41 or 42, wherein the angle range is defined by a cone that is substantially perpendicular to the layer having the periodic structure.
44. A method for calibrating a fabrication process, comprising the following steps:
   a. carrying out a method according to any of the clauses 41 to 43 to determine deviations in the fabrication process; and
   b. generating a correction signal for adjusting a fabrication process parameter based on the determined deviations in the fabrication process.
45. An inspection tool comprising:
   a sample holder for holding a sample;
   an illumination system for illuminating a sample in the sample holder;
   a detection system for detecting light transmitted through a sample in the sample holder; and
   a processing unit configured to determine deviations in a fabrication process used to fabricate a sample with a layer having a periodic structure intended to cause a corresponding part of the layer to be fully reflective for light having a wavelength in a wavelength range and having an angle of incidence in an angle range from an output of the detection system,
   wherein the illumination system is configured to emit light having a wavelength in the wavelength range and having an angle of incidence in the angle range.
46. An inspection tool according to clause 45, wherein the angle range is defined by a cone that is substantially perpendicular to the layer having the periodic structure.
47. A fabrication system comprising a lithographic apparatus for carrying out at least a part of a fabrication process, and an inspection tool according to clause 45 or 46.

While specific embodiments of the invention have been described above, it will be appreciated that the invention may be practiced otherwise than as described. The descriptions above are intended to be illustrative, not limiting. Thus it will be apparent to one skilled in the art that modifications may be made to the invention as described without departing from the scope of the claims set out below.

The present disclosure has been described in connection with various embodiments, other embodiments of the invention will be apparent to those skilled in the art from consideration of the specification and practice of the invention disclosed herein. It is intended that the specification and examples be considered as exemplary only, with a true scope and spirit of the invention being indicated by the following claims.

The descriptions above are intended to be illustrative, not limiting. Thus, it will be apparent to one skilled in the art that modifications may be made as described without departing from the scope of the claims set out below.

The invention claimed is:
1. An inspection tool comprising:
   a sample holder configured to hold a sample;
   an illumination system configured to illuminate a sample in the sample holder;
   a detection system configured to detect radiation reflected and/or scattered from a sample in the sample holder; and
   a processing unit configured to determine deviations in a fabrication process used to fabricate a sample with a layer having a periodic structure intended to cause a corresponding part of the layer to be fully reflective for radiation having a wavelength in a wavelength range and having an angle of incidence in an angle range from an output of the detection system, the periodic structure having one or more surfaces that collectively define an illumination surface and the periodic structure having a depth extending from the illumination surface that is shorter than the cross-sectional dimensions of the illumination surface, wherein the illumination system is configured to emit radiation having a wavelength in the wavelength range and having an angle of incidence on the illumination surface in the angle range.

2. The inspection tool according to claim 1, wherein the detection system is configured to detect radiation reflected and/or scattered from the layer of the sample including measuring at least one selected from:
wavelength;
amplitude;
phase; or
polarization.

3. The inspection tool according to claim 1, wherein the processing unit includes a non-transitory computer readable medium including a relationship between one or more selected from: a detected wavelength, amplitude, phase or polarization, and one or more selected from:
critical dimension;
pitch;
placement;
thickness;
displacement between two layers; or
random particles.

4. The inspection tool according to claim 1, wherein the detection system is further configured to detect radiation transmitted through the sample.

5. The inspection tool according to claim 1, wherein the processing unit is configured to generate, based on the determined deviations in the fabrication process, a correction signal for adjusting a fabrication process parameter.

6. The inspection tool according to claim 5, wherein the correction signal includes a correction signal for adjusting a parameter of an apparatus used during the fabrication process.

7. The inspection tool according to claim 5, wherein the correction signal includes a correction signal for adjusting a design parameter used as input to the fabrication process.

8. A fabrication system comprising:
a lithographic apparatus configured to carry out at least a part of a fabrication process, and
the inspection tool according to claim 1.

9. The fabrication system according to claim 8, configured to generate, based on the determined deviations in the fabrication process, a correction signal for adjusting a parameter of an illumination system or a projection system of the lithographic apparatus.

10. The fabrication system according to claim 8, configured to generate, based on the determined deviations in the fabrication process, a correction signal for adjusting a relationship between a pattern imparted to radiation by a patterning device and a corresponding intended structure on the substrate.

11. A method for determining deviations in a fabrication process, the method comprising:
providing a sample with a layer having a periodic structure fabricated using the fabrication process and intended to cause a corresponding part of the layer to be fully reflective for radiation having a wavelength in a wavelength range and having an angle of incidence in an angle range, the periodic structure having one or more surfaces that collectively define an illumination surface and the periodic structure having a depth extending from the illumination surface that is shorter than the cross-sectional dimensions of the illumination surface;
illuminating the sample with radiation having a wavelength in the wavelength range and an angle of incidence on the surface in the angle range;
detecting radiation reflected and/or scattered from the layer of the sample; and
determining deviations in the fabrication process from the detected radiation.

12. The method according to claim 11, further comprising generating, based on the determined deviations in the fabrication process, a correction signal for adjusting a fabrication process parameter.

13. The method according to claim 12, wherein the correction signal includes a correction signal for adjusting a parameter of an apparatus used during the fabrication process.

14. The method according to claim 12, wherein the correction signal includes a correction signal for adjusting a design parameter used as input to the fabrication process.

15. A sample with a layer having a periodic structure intended to cause a corresponding part of the layer to be fully reflective for radiation having a wavelength in a wavelength range and having an angle of incidence in an angle range, wherein the sample is suitable to be used in the method according to claim 11.

16. The sample according to claim 15, wherein the layer having the periodic structure is intended to cause the corresponding part of the layer to be fully reflective for radiation having a wavelength in a wavelength range and all angles of incidence.

17. The sample according to claim 15, wherein the periodic structure is a periodic dielectric structure.

18. The method according to claim 11, further comprising detecting radiation transmitted through the sample.

19. The method according to claim 11, further comprising using a relationship between one or more selected from: a detected wavelength, amplitude, phase or polarization, and one or more selected from:
critical dimension;
pitch;
placement;
thickness;
displacement between two layers; or
random particles.

20. The method according to claim 11, wherein the periodic structure is a periodic dielectric structure.

* * * * *